(12) United States Patent
Chen et al.

(10) Patent No.: US 12,166,082 B2
(45) Date of Patent: Dec. 10, 2024

(54) SILICON CARBIDE SEMICONDUCTOR POWER TRANSISTOR AND METHOD OF MANUFACTURING THE SAME

(71) Applicant: LEAP Semiconductor Corp., Taoyuan (TW)

(72) Inventors: Wei-Fan Chen, Taichung (TW); Kuo-Chi Tsai, Taoyuan (TW)

(73) Assignee: LEAP Semiconductor Corp., Taoyuan (TW)

( * ) Notice: Subject to any disclaimer, the term of this patent is extended or adjusted under 35 U.S.C. 154(b) by 422 days.

(21) Appl. No.: 17/715,029

(22) Filed: Apr. 6, 2022

(65) Prior Publication Data

US 2023/0326972 A1 Oct. 12, 2023

(51) Int. Cl.
| | | |
|---|---|---|
| *H01L 29/16* | (2006.01) | |
| *H01L 21/82* | (2006.01) | |
| *H01L 29/423* | (2006.01) | |
| *H01L 29/66* | (2006.01) | |
| *H01L 29/78* | (2006.01) | |

(52) U.S. Cl.
CPC ...... *H01L 29/1608* (2013.01); *H01L 21/8213* (2013.01); *H01L 29/4236* (2013.01); *H01L 29/66068* (2013.01); *H01L 29/7813* (2013.01)

(58) Field of Classification Search
CPC .................................................. H01L 29/0852
See application file for complete search history.

(56) References Cited

U.S. PATENT DOCUMENTS

| | | |
|---|---|---|
| 4,145,703 A | 3/1979 | Blanchard et al. |
| 6,008,520 A | 12/1999 | Darwish et al. |
| 6,117,135 A | 9/2000 | Schlapfer |
| 10,177,233 B2 | 1/2019 | Saitoh et al. |
| 10,186,610 B2 | 1/2019 | Kobayashi et al. |
| 10,236,372 B2 | 3/2019 | Okumura et al. |
| 10,468,509 B2 | 11/2019 | Okumura |
| 10,490,658 B2 | 11/2019 | Knoll et al. |

(Continued)

FOREIGN PATENT DOCUMENTS

| | | |
|---|---|---|
| JP | 5668576 | 2/2015 |
| TW | 200701454 | 1/2007 |

OTHER PUBLICATIONS

T. Hirao; et al., "4H—SiC MOSFETs on (03-38) Face," Materials Science Forum, vols. 389-393, Apr. 2002, pp. 1065-1068.

(Continued)

*Primary Examiner* — Daniel Whalen
(74) *Attorney, Agent, or Firm* — JCIPRNET

(57) ABSTRACT

A silicon carbide semiconductor power transistor and a method of manufacturing the same. The silicon carbide semiconductor power transistor of the disclosure includes a substrate made of silicon carbide (SiC), a drift layer disposed on the substrate, a gate layer formed on the drift layer, a plurality of first and second well pick-up regions disposed in the drift layer, a plurality of source electrodes, and a plurality of contacts. A plurality of V-grooves is formed in the drift layer. A first opening is formed in the gate layer at a bottom of each of the V-grooves, and a second opening is formed in the gate layer at a top of the drift layer between the V-grooves. The plurality of contacts is disposed inside the second opening to be in direct contact with the second well pick-up regions.

17 Claims, 18 Drawing Sheets

(56) References Cited

U.S. PATENT DOCUMENTS

| | | | |
|---|---|---|---|
| 10,522,672 | B2 | 12/2019 | Kumagai |
| 2008/0096335 | A1 | 4/2008 | Zhang et al. |
| 2010/0081239 | A1 | 4/2010 | Min et al. |
| 2013/0328062 | A1 | 12/2013 | Hisamoto et al. |
| 2014/0027784 | A1* | 1/2014 | Wada .................. H01L 21/3065 257/77 |
| 2017/0077087 | A1 | 3/2017 | Horikawa et al. |
| 2019/0319102 | A1* | 10/2019 | Tsuno .................. H01L 21/049 |
| 2021/0175351 | A1 | 6/2021 | Bothe et al. |
| 2023/0335595 | A1* | 10/2023 | Chen .................. H01L 29/0865 |

OTHER PUBLICATIONS

Toru Hiyoshi; et al., "SiC high channel mobility MOSFET," SEI Technical Review, No. 77, Oct. 2013, pp. 122-126.

Hidenori Koketsu; et al., "Shape Control of Trenched 4H—SiC C-Face by Thermal Chlorine Etching," Japanese Journal of Applied Physics, vol. 51, No. 5, May 2012, pp. 1-6.

Yu Saitoh; et al., "V-groove trench gate SiC MOSFET with a double reduced surface field junction termination extensions structure," Japanese Journal of Applied Physics, vol. 58, No. SB, Mar. 2019, pp. 1-7.

Keita Tachiki et al., "Short-Channel Effects in SiC MOSFETs Based on Analyses of Saturation Drain Current," in IEEE Transactions on Electron Devices, vol. 68, No. 3, Mar. 2021, pp. 1382-1384.

I. O. Usov; et al., "Diffusion of boron in 6H and 4H SiC coimplanted with boron and nitrogen ions," Journal of Applied Physics, vol. 96, No. 9, Nov. 2004, pp. 4960-4964.

Ilkham G. Atabaev; et al., "Influence of Defects on Low Temperature Diffusion of Boron in SiC," Materials Sciences and Applications vol. 2, No. 9, Sep. 2011, pp. 1205-1211.

Keiji Wada; et al., "Fast switching 4H—SiC V-groove trench MOSFETs with buried P+ structure," 2014 IEEE 26th International Symposium on Power Semiconductor Devices & IC's (ISPSD), Jun. 15-19, 2014, pp. 225-228.

Kosuke Uchida; et al., "High Current SiC Transistors for Automotive Applications," SEI Technical Review, No. 88, Apr. 2019, pp. 63-66.

"Notice of allowance of Taiwan Counterpart Application", issued on Aug. 30, 2023, p. 1-p. 4.

* cited by examiner

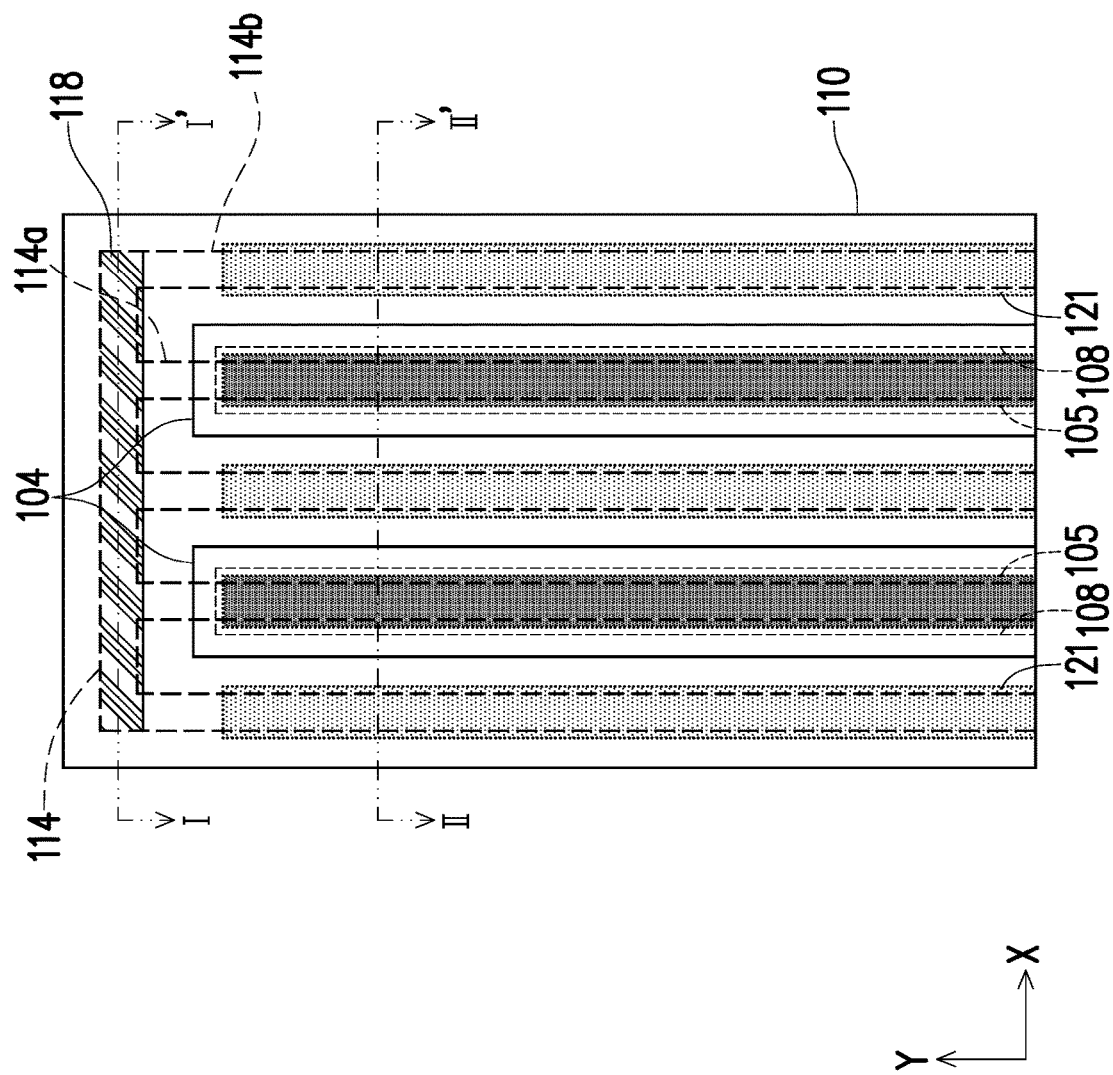

SILICON CARBIDE SEMICONDUCTOR POWER TRANSISTOR AND METHOD OF MANUFACTURING THE SAME

BACKGROUND

Technical Field

The disclosure relates to a silicon carbide semiconductor power transistor, and particularly relates to a silicon carbide semiconductor power transistor and a method of manufacturing the same.

Description of Related Art

High voltage, field effect transistors, also known as power transistors or silicon carbide semiconductor power transistors, are well known in the semiconductor arts. Vertical power transistor including an extended drain or drift region can support the applied high voltage when the device is in the "off" state, and this type power transistor are commonly used in power conversion applications such as AC/DC converters for offline power supplies, motor controls, and so on. These power transistor devices can be switched at high voltages and achieve a high blocking voltage in the "off" state while minimizing the resistance to current flow between the drain and the source, often referred to as the specific on resistance ($R_{on}$), in the "on" state.

Silicon carbide (SiC) MOSFETs are highly noticed due to their superior physical properties over silicon-based devices of the same device area. For example, SiC MOSFETs are known to exhibit higher blocking voltage, lower $R_{on}$, and higher thermal conductivity as compared to silicon MOSFETs.

4H—SiC MOSFETs are promising building blocks for low loss and high voltage switching power modules. One of the key challenges for 4H—SiC power MOSFETs is to achieve both low specific on-resistance and high threshold voltage at the same time. This is because the nitridation process, which is generally used after gate oxidation in order to reduce the channel resistance, typically ends up with a lower threshold voltage rather than high channel mobility. N-channel 4H—SiC MOSFETs on (03-38) crystal plane indicated the highest channel mobility among examined crystal orientation of the 4H—SiC MOSFETs. However, the (03-38) crystal plane substrate is not easy to grow and very costly. N-MOSFETs with channel (03-38) crystal plane has been researched for to overcome above problems.

However, V-grooves 4H—SiC N-MOSFETs with channel (03-38) crystal plane are more likely to have larger Cgd capacitance because a drain region is in a bottom of a gate located in a bottom of V-grooves that is the directly connect to a backside side of a drain side without any shielding element. The high Cgd capacitance suffer from the transient loss in the device during switch on and switch off operation of MOSFET. What is even worse, the Miller effect of large Cgd capacitance of MOSFET may cause devices operation fail, this is why certain precautions such as reducing the sides effect of Cgd capacitance are required.

SUMMARY

The disclosure provides a silicon carbide semiconductor power transistor for solving the problem of the sides effect of high Cgd capacitance of traditional V-groove N-MOSFETs.

The disclosure further provides a method of manufacturing a silicon carbide semiconductor power transistor to reduce Cgd capacitance of V-groove N-MOSFETs.

The silicon carbide semiconductor power transistor of the disclosure includes a substrate made of silicon carbide (SiC), a drift layer disposed on a plane of the substrate, a gate layer formed on the drift layer, a gate insulation layer disposed between the drift layer and the gate layer, a plurality of first well regions disposed in the drift layer, a plurality of second well regions disposed in a top of the drift layer, a plurality of source regions disposed within the first well regions, a plurality of first well pick-up regions disposed in the drift layer, a plurality of second well pick-up regions disposed in the second well regions, a plurality of source electrodes, and a plurality of contacts. A plurality of V-grooves is formed in the drift layer. The gate layer covers a bottom and sidewalls of each of the V-grooves and the top of the drift layer between the V-grooves. The first opening is formed in the gate layer at the bottom of each of the V-grooves, and the second opening is formed in the gate layer at the top of the drift layer between the V-grooves. The plurality of first well regions are around the bottom and the sidewalls of each of the V-grooves. The plurality of second well regions are disposed in the top of the drift layer between the V-grooves. The plurality of first well pick-up regions pass through the plurality of source regions and contacts with the plurality of first well regions. The plurality of source electrodes is disposed inside the first openings on the bottom of each of the V-grooves to be in direct contact with the first well pick-up regions and the source regions. The plurality of contacts is disposed inside the second opening on the top of the drift layer between the V-grooves to be in direct contact with the second well pick-up region.

In an embodiment of the disclosure, the V-grooves are parallel to each other.

In an embodiment of the disclosure, in a top view, the V-grooves comprise first wave-shaped V-grooves and second wave-shaped V-grooves mirrored with respect to each other and extended along a first direction, each of the first and second wave-shaped V-grooves having straight sections that are alternately connected by curved sections, the straight sections of the first and second wave-shaped V-grooves are alternately separated by a first distance and a second distance, the first distance is greater than the second distance, and the second opening is formed on the top between the first and second wave-shaped V-grooves separated from the first distance.

In an embodiment of the disclosure, the silicon carbide semiconductor power transistor further includes a plurality of gate electrodes disposed on the gate layer between the first and second wave-shaped V-grooves separated from the second distance.

In an embodiment of the disclosure, the silicon carbide semiconductor power transistor further includes a connection section extends along a second direction and electrically connects with the first well pick-up regions and the second well pick-up region, wherein the second direction is perpendicular to the first direction.

In an embodiment of the disclosure, the plane of the substrate is one of {1000} orientation planes, one of {1100} orientation planes, or one of {11-20} orientation planes.

In an embodiment of the disclosure, the substrate, the drift layer, and the source regions have a first conductive type, and the first and second well regions and the first and second well pick-up regions have a second conductive type.

In an embodiment of the disclosure, the bottom of each of the V-grooves exposed from the first opening and the top of the drift layer exposed from the second opening have an exposed area with a width of from 1.0 µm to 2.0 µm, respectively.

The method of manufacturing a silicon carbide semiconductor power transistor includes forming a drift layer on an upper surface of a silicon carbide (SiC) substrate, and then forming a plurality of V-grooves in the drift layer. A plurality of first well regions is formed in the drift layer around a bottom and sidewalls of each of the V-grooves. A plurality of second well regions is formed in a top of the drift layer between the V-grooves. A plurality of source regions is formed within the first well regions. A plurality of first well pick-up regions is formed in the drift layer to pass through the plurality of source regions and contacts with the plurality of first well regions. A plurality of second well pick-up regions is formed in the second well regions. A gate insulation layer is conformally formed on the top of the drift layer and the bottom and the sidewalls of each of the V-grooves. A gate layer is formed on the gate insulation layer to cover the bottom and the sidewalls of each of the V-grooves and the top of the drift layer between the V-grooves. The gate layer and the gate insulation layer are etched to form a first opening at the bottom of each of the V-grooves and form a second opening at the top of the drift layer between the V-grooves. A plurality of source electrodes is formed inside the first openings on the bottom of each of the V-grooves to be in direct contact with the first well pick-up regions and the source regions. A plurality of contacts is formed inside the second opening on the top of the drift layer between the V-grooves to be in direct contact with the second well pick-up region.

In another embodiment of the disclosure, the V-grooves are parallel to each other.

In another embodiment of the disclosure, the step of forming the plurality of V-grooves 304 comprises forming the V-grooves comprising first wave-shaped V-grooves and second wave-shaped V-grooves mirrored with respect to each other and extended along a first direction, each of the first and second wave-shaped V-grooves having straight sections that are alternately connected by curved sections, the straight sections of the first and second wave-shaped V-grooves are alternately separated by a first distance and a second distance, the first distance is greater than the second distance, and the second opening is formed on the top between the first and second wave-shaped V-grooves separated from the first distance.

In another embodiment of the disclosure, the method further includes forming a plurality of gate electrodes on the gates between the first and second wave-shaped V-grooves separated from the second distance.

In another embodiment of the disclosure, the method further includes forming a connection section to extend along a second direction and electrically connect with the first well pick-up regions and the second well pick-up region, wherein the second direction is perpendicular to the first direction.

In another embodiment of the disclosure, the steps of forming the plurality of first well regions and forming the plurality of second well regions are simultaneously performed.

In another embodiment of the disclosure, the steps of forming the plurality of first well pick-up regions and forming the plurality of second well pick-up regions are simultaneously performed.

In another embodiment of the disclosure, the method further includes forming a drain electrode on a bottom surface of the SiC substrate.

In another embodiment of the disclosure, the upper surface of the SiC substrate is one of {1000} orientation planes, one of {1100} orientation planes, or one of {11-20} orientation planes.

Based on the above, according to the silicon carbide semiconductor power transistor of the disclosure, the second well regions and the second well pick-up regions disposed in the top of the drift layer between the V-grooves are in contact with the contacts that are equal potential with the source electrodes. Hence, a drain-source capacitance (Cgs) is formed in the top of the drift layer between the V-grooves, so as to reduce capacitance. The gate electrodes disposed on the gate layer are not in contact with the second well pick-up regions to form a gate-source capacitance (Cgs). Therefore, the original Cgd capacitance are transferred to Cgs (gate to substrate) capacitance in the disclosure, thus, the side effects of high Cgd can be minimized since the side effects of Cgd capacitance of the disclosure is reduced. The silicon carbide semiconductor power transistor of the disclosure has excellent switch on and switch off energy loss performance and switch on-off reliability.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 4 is a top view of a silicon carbide semiconductor power transistor according to a third embodiment of the disclosure.

DESCRIPTION OF THE EMBODIMENTS

Figure 1:
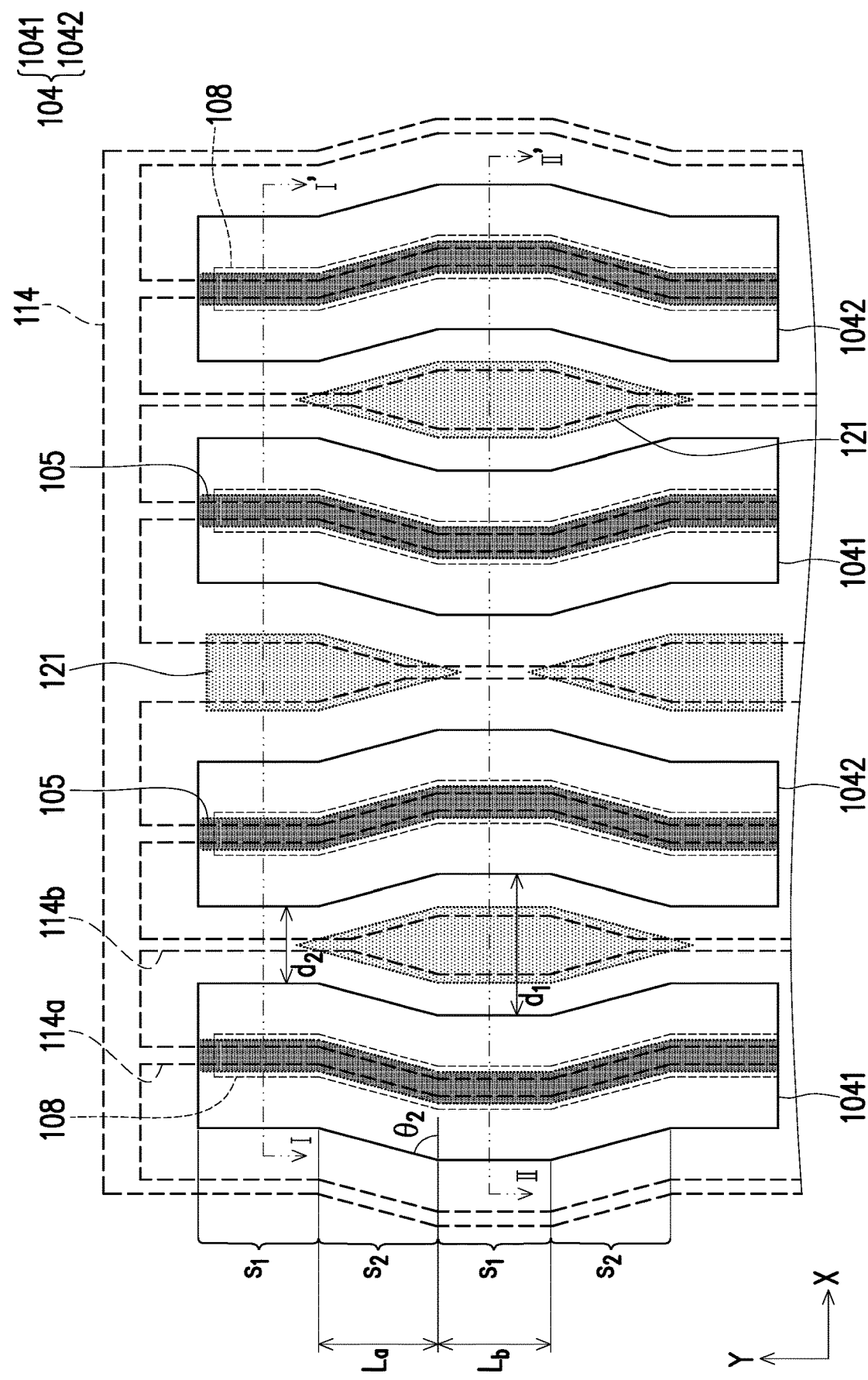
FIG. 1 is a top view of a silicon carbide semiconductor power transistor according to a first embodiment of the disclosure.

With reference to the drawings attached, the disclosure will be described by means of the embodiments below. Nevertheless, the disclosure may be embodied in many different forms and should not be construed as limited to the embodiments set forth herein. In the drawings, for the purpose of clarity and specificity, the sizes and the relative sizes of each layer and region may not be illustrated in accurate proportion.

Figure 2A:
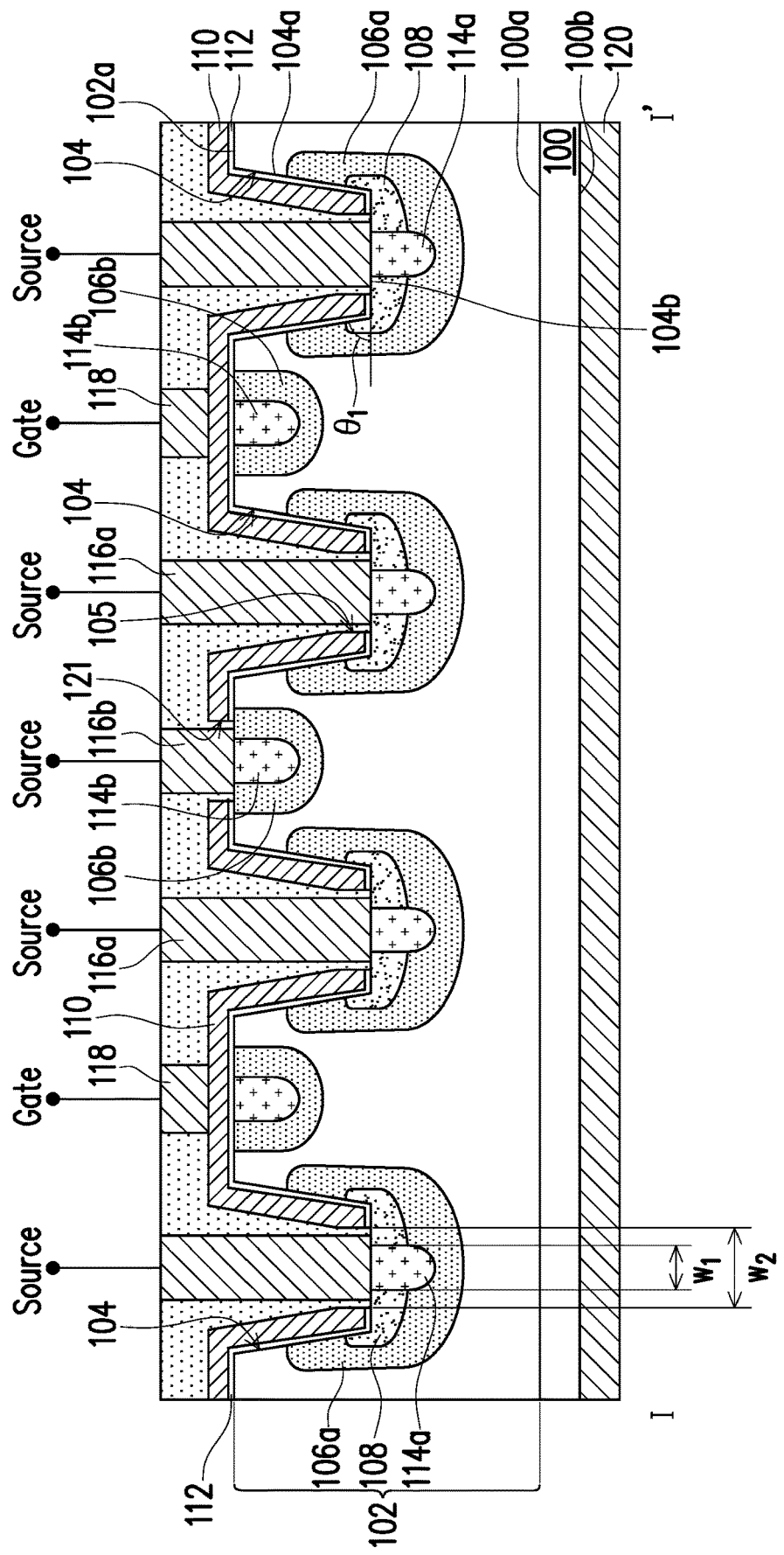
FIG. 2A shows a cross-sectional view of line I-I' of the silicon carbide semiconductor power transistor of FIG. 1.

FIG. 1 is a top view of a silicon carbide semiconductor power transistor according to a first embodiment of the disclosure, and FIG. 2A shows a cross-sectional view of line I-I' of the silicon carbide semiconductor power transistor of FIG. 1. Some reference symbols and labeled representations of FIG. 2A are omitted in FIG. 1 to clear a disposition of the silicon carbide semiconductor power transistor of the first embodiment in the top view.

Referring to FIG. 1, the silicon carbide semiconductor power transistor (also called as "V-groove N-MOSFET") of the first embodiment includes a plurality of V-grooves 104, a plurality of source regions 108, a connection section 114, a plurality of first well pick-up regions 114a, a plurality of second well pick-up regions 114b, a first opening 105 (represented by the region filled with dense dots) and a second opening 121 (represented by the region filled with sparse dots).

Referring to FIG. 1 again, the V-grooves 104 comprise first wave-shaped V-grooves 1041 and second wave-shaped V-grooves 1042 mirrored with respect to each other and extended along a first direction Y. Each of the first and second wave-shaped V-grooves 1041, 1042 has straight sections $s_1$ that are alternately connected by curved sections $s_2$. A tilt angle $\theta_2$ between an extension direction of the curved sections $s_2$ and the second direction X is, for example, 60°. A ratio of the length $L_a$ along the first direction Y of each of the curved sections $s_2$ to the length $L_b$ along the first direction Y of each of the straight sections $s_1$ is 0.5 or less, for instance. The straight sections $s_1$ of the first and second wave-shaped V-grooves 1041, 1042 are alternately separated by a first distance $d_1$ and a second distance dz. The first distance $d_1$ is greater than the second distance $d_2$. The second openings 121 are formed on a top 102a (referring to FIG. 2A) between the first and second wave-shaped V-grooves 1041, 1042 separated from the first distance $d_1$, and between the curved sections $s_2$ of the first and second wave-shaped V-grooves 1041, 1042. The second opening 121 may be pentagonal shape or a hexagonal shape; however, the disclosure is not limited herein. Therefore, the silicon carbide semiconductor power transistor may reduce an integrated area to effectively reduce a size of a semiconductor device.

Referring to FIG. 1 once more, the connection section 114 extends along a second direction X, which is perpendicular to the first direction Y. The connection section 114 electrically connects with (for example, be directly in contact with) the first well pick-up regions 114a and the second well pick-up region 114b to make the first well pick-up regions 114a and the second well pick-up region 114b having equal potential.

FIG. 2A shows a cross-sectional view of line I-I' of the silicon carbide semiconductor power transistor of FIG. 1, but the relative sizes of the first opening 105 and the second opening 121 are not be illustrated in proportion with those in FIG. 1.

Referring to FIG. 2A, the silicon carbide semiconductor power transistor of the first embodiment includes at least a substrate 100 made of silicon carbide (SiC), a drift layer 102 with the plurality of V-grooves 104 formed therein, a gate layer 110 formed on the drift layer 102, a gate insulation layer 112 disposed between the drift layer 102 and the gate layer 110, a plurality of first well regions 106a disposed in the drift layer 102, a plurality of second well regions 106b disposed in the top 102a of the drift layer 102, the plurality of source regions 108 disposed within the first well regions 106a, the plurality of first well pick-up regions 114a disposed in the drift layer 102, the plurality of second well pick-up regions 114b disposed in the second well regions 106b, a plurality of source electrodes 116a disposed inside the first openings 105, a plurality of contacts 116b disposed inside the second opening 121, and a plurality of gate electrodes 118 disposed on the gate layer 110.

Referring to FIG. 2A again, the drift layer 102 is disposed on a plane 100a of the substrate 100. In one embodiment, the plane 100a of the substrate 100 is one of {1000} orientation planes, and it is helpful to from the transistor with improved channel mobility and high weak inversion threshold in the (03-38) crystal plane. In another embodiment, the plane 100a of the substrate 100 can be one of the {1100} orientation planes or one of the {11-20} orientation planes. A channel region of the silicon carbide semiconductor power transistor is formed in a sidewall 104a of each of the V-grooves 104, and an orientation plane of the channel region is (03-38) crystal plane. In some embodiments, the (03-38) crystal plane of the channel region represents the face tilted by 54.7° toward the direction from the {1000} orientation plane and tilted by 35.3° toward the direction from the {11-20} orientation plane. Moreover, the plane 100a of the substrate 100 has an off-axis orientation equal to 5° or less to one of the {1000} orientation planes, the {1100} orientation planes, or the {11-20} orientation planes, preferably, 3° or less to one of the {1000} orientation planes, the {1100} orientation planes, or the {11-20} orientation planes.

Then, referring to FIG. 2A, the V-grooves 104 are formed in the drift layer, wherein a tilt angle $\theta_1$ between the sidewall 104a and a bottom 104b of each of the V-grooves 104 is, for example, 30° to 65°. The gate layer 110 covers the bottom 104b and the sidewalls 104a of each of the V-grooves 104 and the top 102a of the drift layer 102 between the V-grooves 104. For example, the gate layer 110 are polysilicon and conformally deposited on the bottom 104b and the sidewalls 104a of each of the V-grooves 104 and the top 102a of the drift layer 102 between the V-grooves 104. The thickness of the gate insulation layer 112 is, for instance, ranged from 300 Å to 1,200 Å.

Referring to FIGS. 1 and 2A. The first well regions 106a are around the bottom 104b and the sidewalls 104a of each of the V-grooves 104. The second well regions 106b are between the V-grooves 104. The bottom 104b of each of the V-grooves 104 is in direct contact with each of the source regions 108. The first well pick-up regions 114a pass through the plurality of source regions 108 and contact with the plurality of first well regions 106a. The first opening 105 is formed in the gate layer 110 at the bottom 104b of each of the V-grooves 104, and the second opening 121 is formed in the gate layer 110 at the top 102a of the drift layer 102 between the V-grooves 104. The source electrodes 116a are on the bottom 104b of each of the V-grooves 104 to be in direct contact with the first well pick-up regions 114a and the source regions 108, but the source electrodes 116a are not in contact with the gate layer 110. The contacts 116b are on the top 102a of the drift layer 102 between the V-grooves 104 to be in direct contact with the second well regions 106b and the second well pick-up region 114b, but the contacts 116b are not in contact with the gate layer 110. The source electrodes 116a and the contacts 116b are electrically connected to sources. The gate electrodes 118 disposed on the gate layer 110 are not in contact with the second well regions 106b and the second well pick-up regions 114b.

Referring to FIG. 2A once more, the substrate 100, the drift layer 102, and the source regions 108 have a first conductive type; and the first and second well regions 106a, 106b and the first and second well pick-up regions 114a, 114b have a second conductive type. For example, the substrate 100, the drift layer 102, and the source regions 108 are N type, and the first and second well regions 106a, 106b and the first and second well pick-up regions 114a, 114b are P type. In one embodiment, a width $w_1$ of each of the first well pick-up regions 114a and the second well pick-up regions 114b is from 0.2 µm to 1.0 µm, for instance. In one embodiment, the bottom 104b of each of the V-grooves 104 exposed from the first opening 105 and the top 102a of the drift layer 102 exposed from the second opening 121 have an exposed area with a width $w_2$ of from 1.0 µm to 2.0 µm, respectively, for instance. The term "width" refers to the distance between two sides of the region (e.g. the first well pick-up regions 114a, the second well pick-up regions 114b, the first openings 105, or the second openings 121) in the cross-sectional view of the substrate 100. In the first embodiment, the silicon carbide semiconductor power transistor further includes a drain electrode 120. The drain electrode 120 is disposed on a back 100b of the substrate 100.

In some embodiments, a doping concentration of the drift layer 102 is ranged from $3E15/cm^3$ to $4E16/cm^3$, a doping concentration of the first and second well regions 106a, 106b are ranged from $4.2E16/cm^3$ to $5.6E17/cm^3$, and a doping concentration of the source regions 108 is ranged from $5E17/cm^3$ to $5E19/cm^3$. However, the disclosure is not limited herein. The doping concentrations of the drift layer 102, the first and second well regions 106a, 106b, and the source regions 108 may be modified as per the desired design. Moreover, the doping concentration of the first and second well pick-up regions 114a, 114b are $5E18/cm^3$ to $2E20/cm^3$, for instance.

Figure 2B:
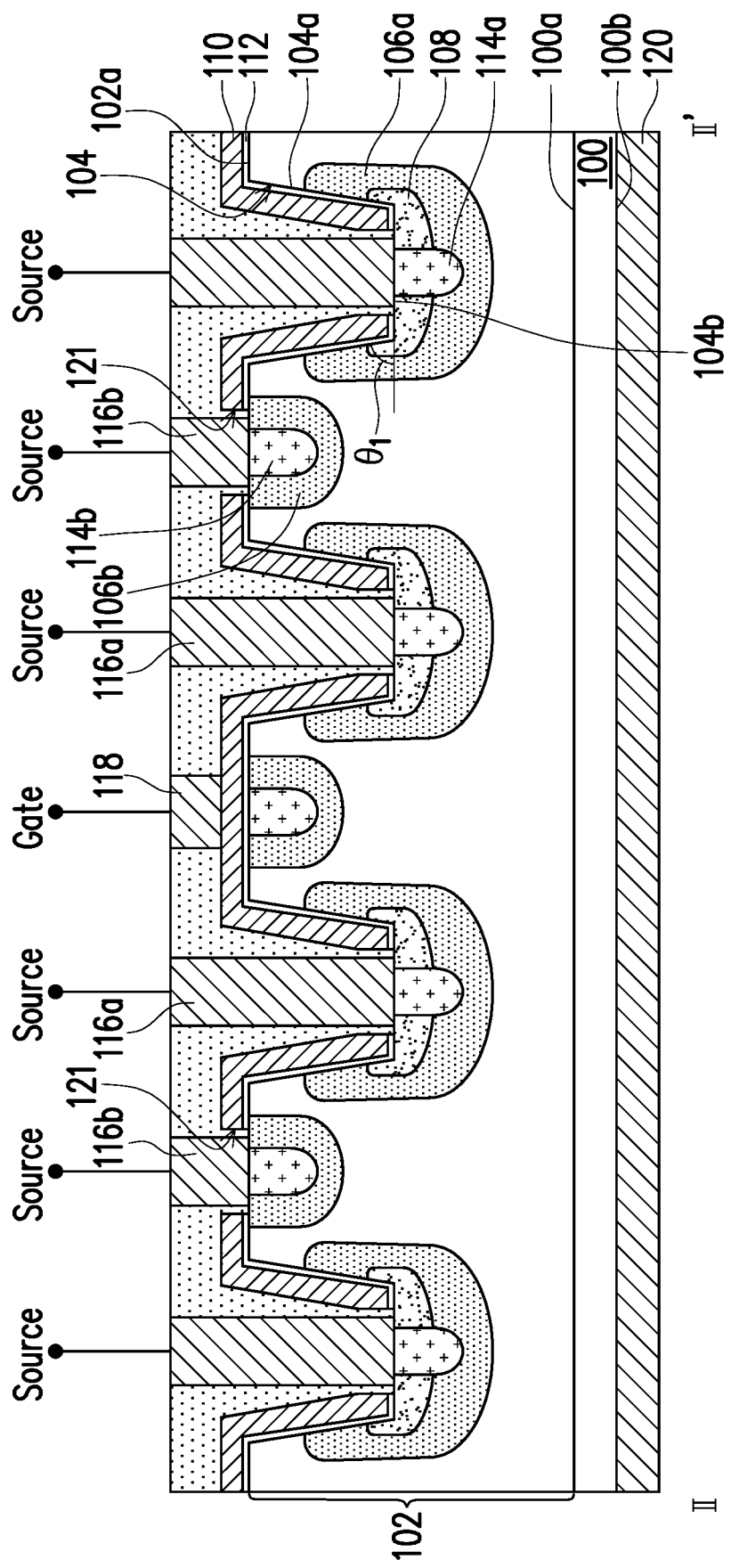
FIG. 2B shows a cross-sectional view of line II-II' of the silicon carbide semiconductor power transistor of FIG. 1.

FIG. 2B shows a cross-sectional view of line II-II' of the silicon carbide semiconductor power transistor of FIG. 1.

Referring to FIG. 2B, except for the relative positions of the first opening 105 and the second opening 121, the definition of the reference symbols and labeled representations are the same as FIG. 2A, and will not be repeated herein.

FIGS. 3A to 3L are cross-sectional views illustrating steps of a method of manufacturing a silicon carbide semiconductor power transistor according to a second embodiment of the disclosure.

Figure 3A:
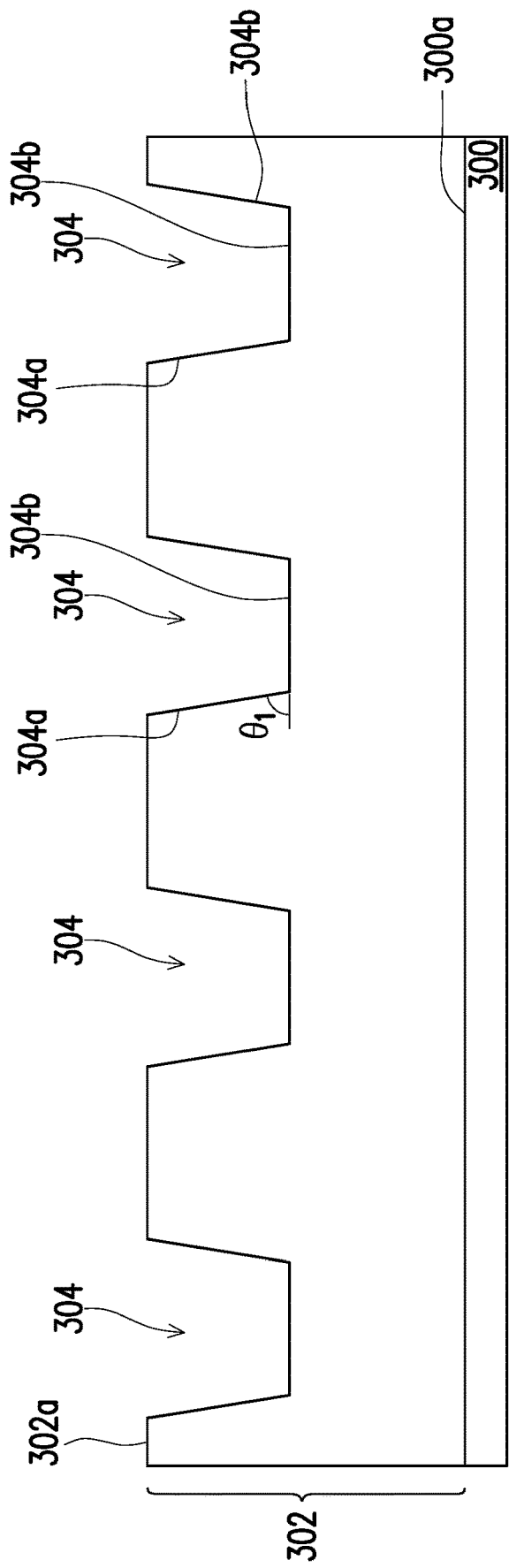
FIGS. 3A to 3L are cross-sectional views illustrating steps of a method of manufacturing a silicon carbide semiconductor power transistor according to a second embodiment of the disclosure.

Referring to FIG. 3A, a silicon carbide (SiC) substrate 300 is utilized, and the SiC substrate 300 may be an n type substrate. A drift layer 302 is formed on an upper surface 300a of the SiC substrate 300, and the drift layer 302 may be an N-drift layer, wherein the doping concentration of the drift layer 302 is ranged from $3E15/cm^3$ to $4E16/cm^3$, for instance. However, the disclosure is not limited herein. The upper surface 300a of the SiC substrate 300 may be one of the {1000} orientation planes, and it is helpful to from the transistor with improved channel mobility and high weak inversion threshold in the (03-38) crystal plane. In another embodiment, the upper surface 300a of the SiC substrate 300 can be one of the {1100} orientation planes or one of the {11-20} orientation planes. Thereafter, a plurality of V-grooves 304 is formed in the drift layer 302, and a channel region is formed in the sidewall 304a of each of the V-grooves 304. In some embodiments, the (03-38) crystal plane of channel region represents the face tilted by 54.7° toward the direction from {1000} orientation plane and tilted by 35.3° toward the direction from (11-20) orientation plane. The upper surface 300a of the SiC substrate 300 has an off-axis orientation equal to 5° or less to one of the {1000} orientation planes, the {1100} orientation planes, or the {11-20} orientation planes. The step of forming the V-grooves 304 may include forming a photoresist (not shown) on a top 302a of the drift layer 302, patterning the photoresist for exposing a portion of the top 302a, etching the drift layer 302 by using the patterned photoresist as etching mask, and then removing the photoresist, wherein a tilt angle $\theta_1$ of 30° to 65° may be formed between a sidewall 304a and the bottom 304b of each of the V-grooves 304 during the etching. In another embodiment, the step of forming V-grooves 304 with (03-38) crystal plane of channel region may include forming a patterned $SiO_2$ hard mask as etching mask, and then performing the thermochemical self-organized etching process in $Cl_2$ ambient.

Figure 3B:
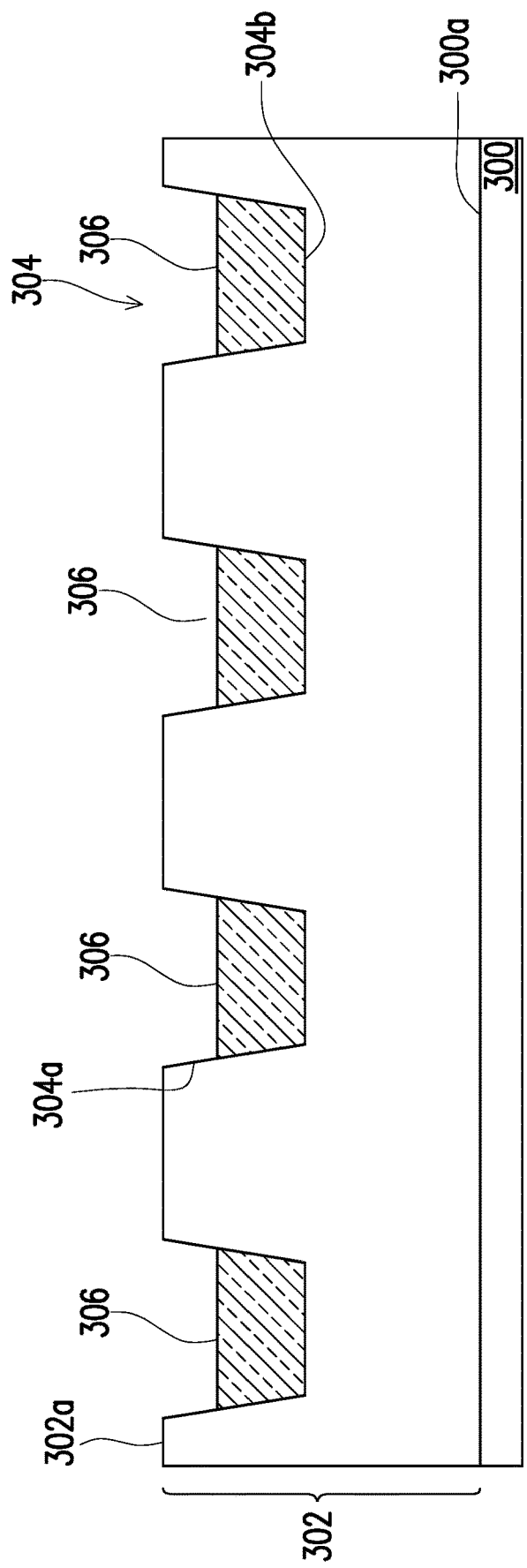

Then, referring to FIG. 3B, in order to form well regions, a coating layer 306 may be formed in the V-grooves 304, and the step of forming the coating layer 306 may include entirely coating a material on the substrate 300 to fill in the V-grooves 304, and then etch back the material until the top 302a and a portion of the sidewall 304a are exposed.

Figure 3C:
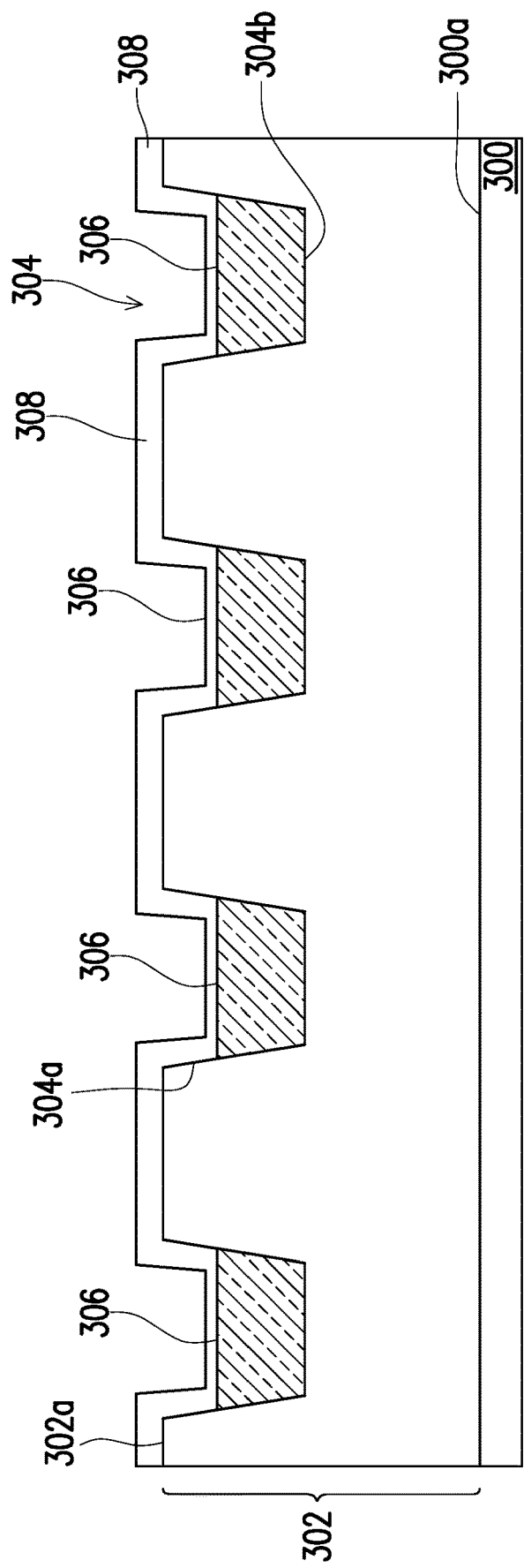

Thereafter, referring to FIG. 3C, a first mask layer 308 is conformally deposited on the top 302a of the drift layer 302, the sidewall 304a of the V-grooves 304, and the coating layer 306. From the perspective of simplifying process, the thickness of the first mask layer 308 on the top 302a is preferably thicker than that of the first mask layer 308 on the coating layer 306, and it can be accomplished by varying the process conditions.

Figure 3D:
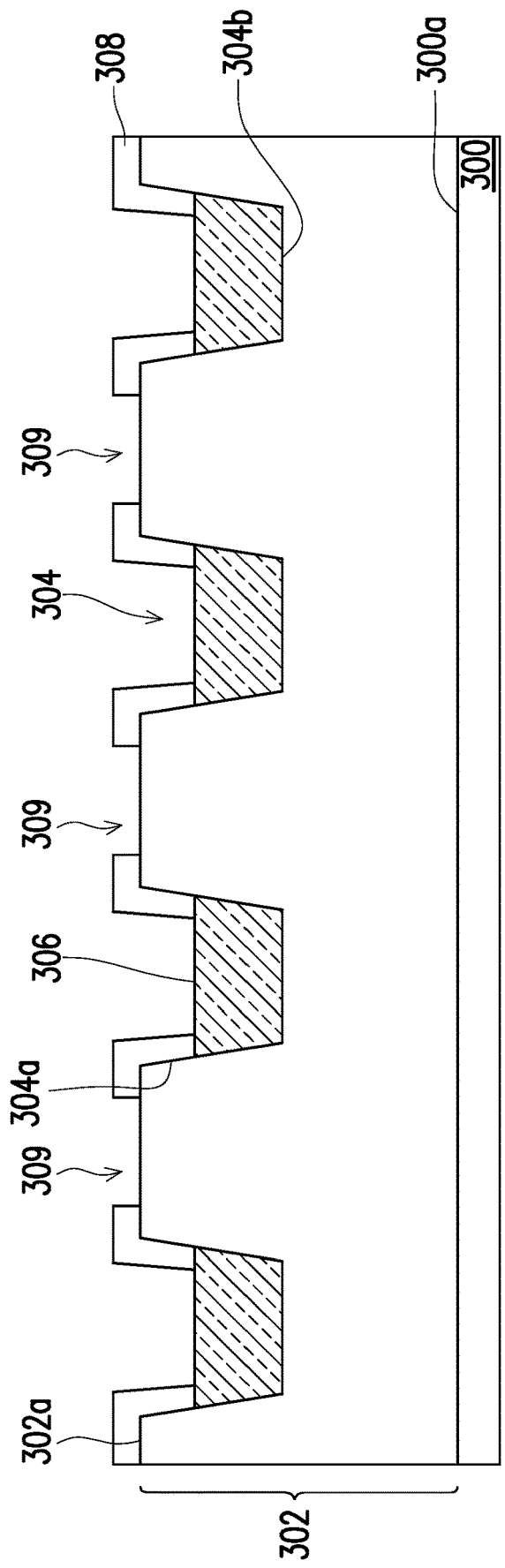

Then, referring to FIG. 3D, the first mask layer 308 is etched back until the coating layer 306 is exposed. Since the thickness of the first mask layer 308 on the top 302a is thicker than that of the first mask layer 308 on the coating layer 306 as shown in FIG. 3C, the first mask layer 308 can be kept on the top 302a and the sidewall 304a even if the thickness is thinned after etching back the first mask layer 308. Thereafter, a plurality of openings 309 is formed in the first mask layer 308 on the top 302a, and the step of forming the openings 309 may include forming a photoresist (not shown) on the coating layer 306 and the first mask layer 308, patterning the photoresist for exposing a portion of the first mask layer 308, etching the first mask layer 308 by using the patterned photoresist as etching mask, and removing the photoresist. Then, a portion of the top 302a is exposed by the openings 309.

Figure 3E:
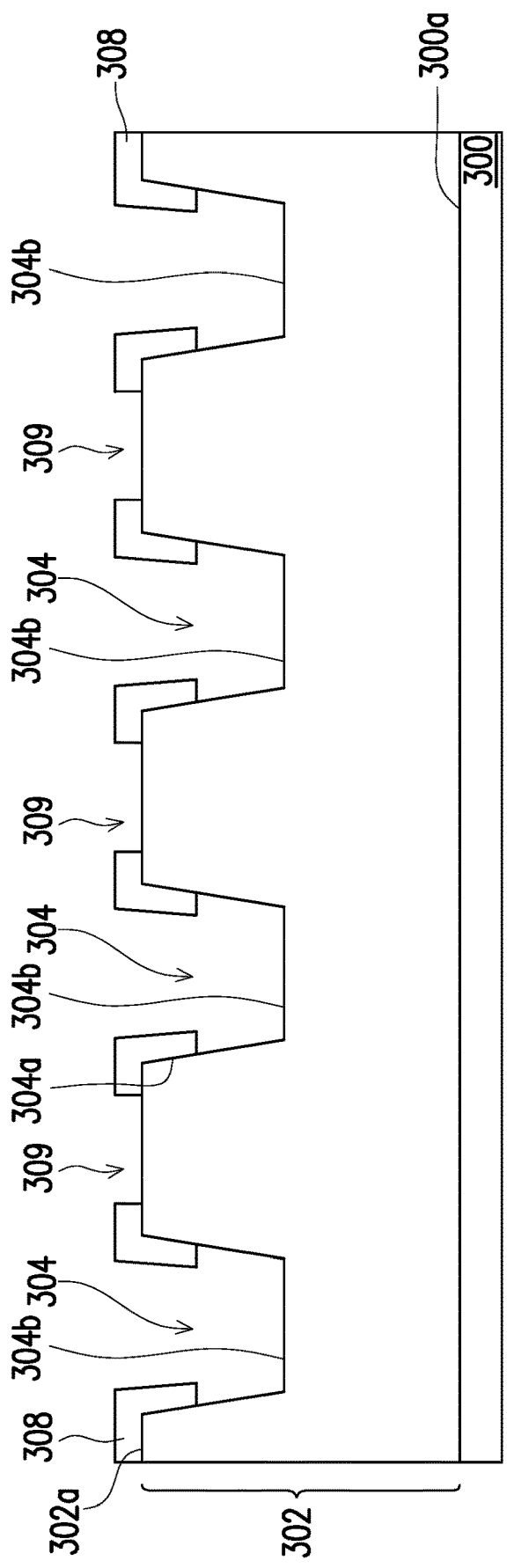

Then, referring to FIG. 3E, the coating layer 306 is removed after forming the openings 309, and the bottom 304b and lower portion of the sidewalls 304a of each of the V-grooves 304 are exposed.

Figure 3F:
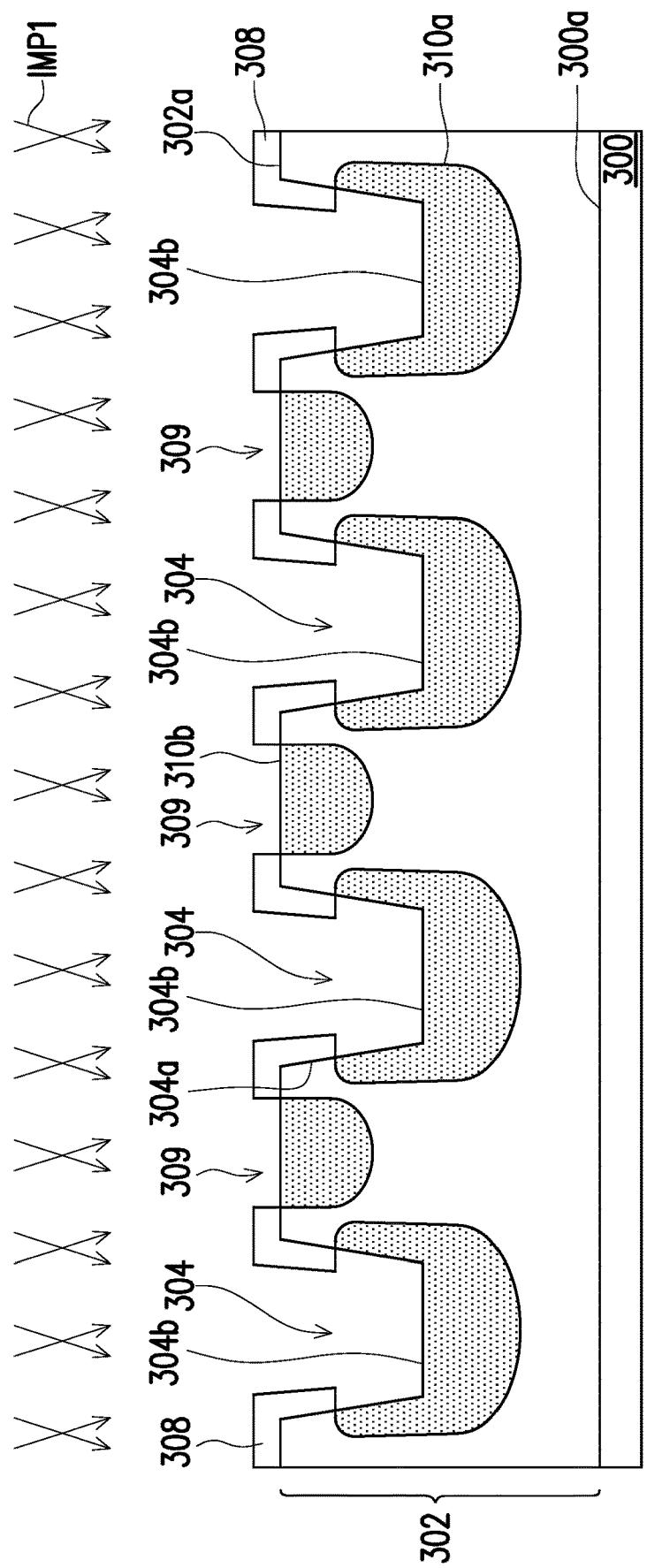

After that, referring to FIG. 3F, a tilt implantation IMP1 is performed on the exposed drift layer 302 of V-grooves 304 and the openings 309, so as to form a plurality of first well regions 310a and a plurality of second well regions 310b in the drift layer 302. The steps of forming the plurality of first well regions 310a and forming the plurality of second well regions 310b are simultaneously performed. However, the disclosure is not limited herein; in another embodiment, the first well regions 310a may be formed before the openings 309 are formed, and then the step of forming the openings 309 is followed by the formation of the second well regions 310b. In one embodiment, the tilt implantation IMP1 may include high tilt implantation and low tilt implantation. The first and second well regions 310a, 310b may be p-type wells, and the doping concentration of the well region 106 is ranged from $4.2E16/cm^3$ to $5.6E17/cm^3$, for instance. The first well regions 310a are formed around the bottom 304b and the sidewalls 304a of each of the V-grooves 304. The second well regions 310b is formed in the top 302a exposed by the opening 309, which is between the V-grooves 304.

Figure 3G:
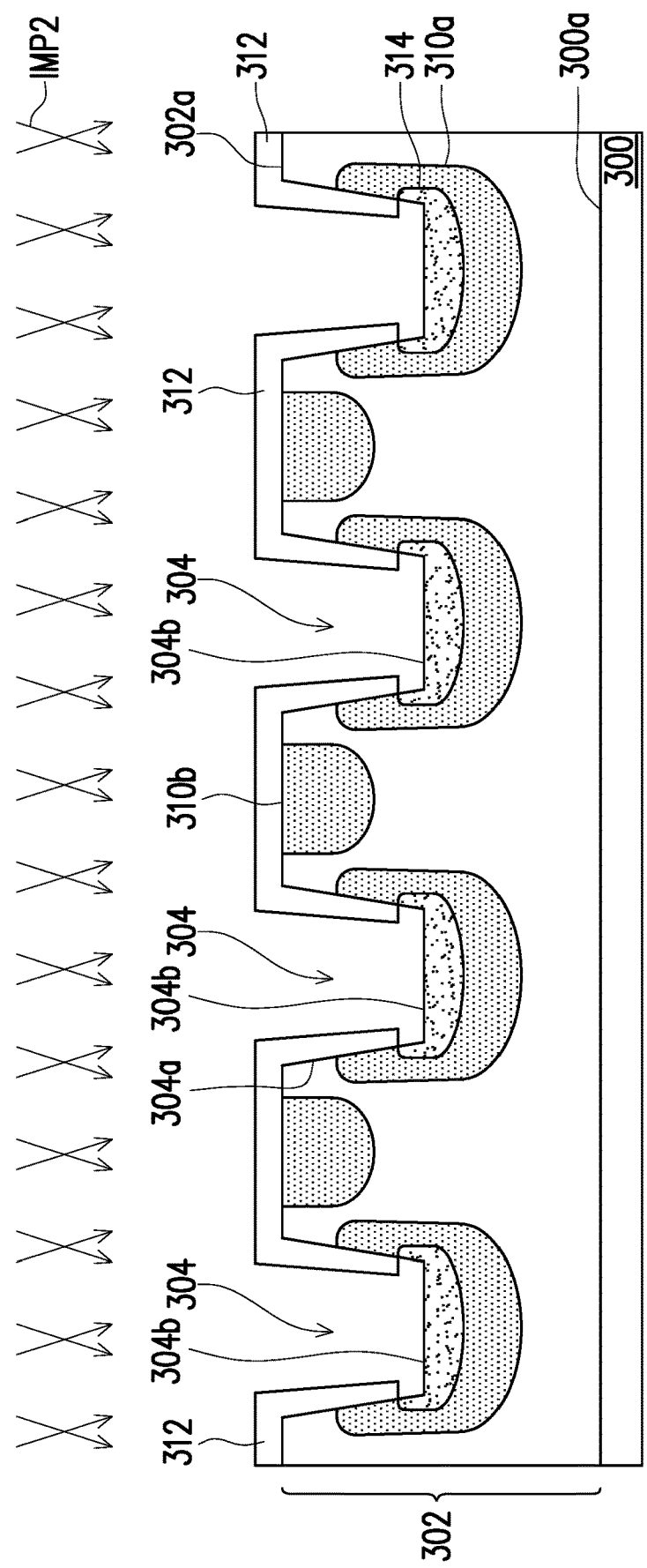

Then, referring to FIG. 3G, the first mask layer 308 is first removed, and then a second mask layer 312 is formed. Except the second mask layer 312 not forming any openings on the top 302a, the step of forming the second mask layer 312 are the same as that of forming the first mask layer 308, and will not be repeated herein. Another tilt implantation IMP2 is then performed on the drift layer 302 to form a plurality of source regions 314 within the first well regions 310a, wherein the bottom 304b of each of the V-grooves 304 is in direct contact with each of the source regions 314. In one embodiment, the tilt implantation IMP2 may include high tilt implantation and low tilt implantation. The source regions 314 may be N+ regions, and the doping concentration of the source regions 314 is ranged from $5E17/cm^3$ to $5E19/cm^3$, for instance.

Figure 3H:
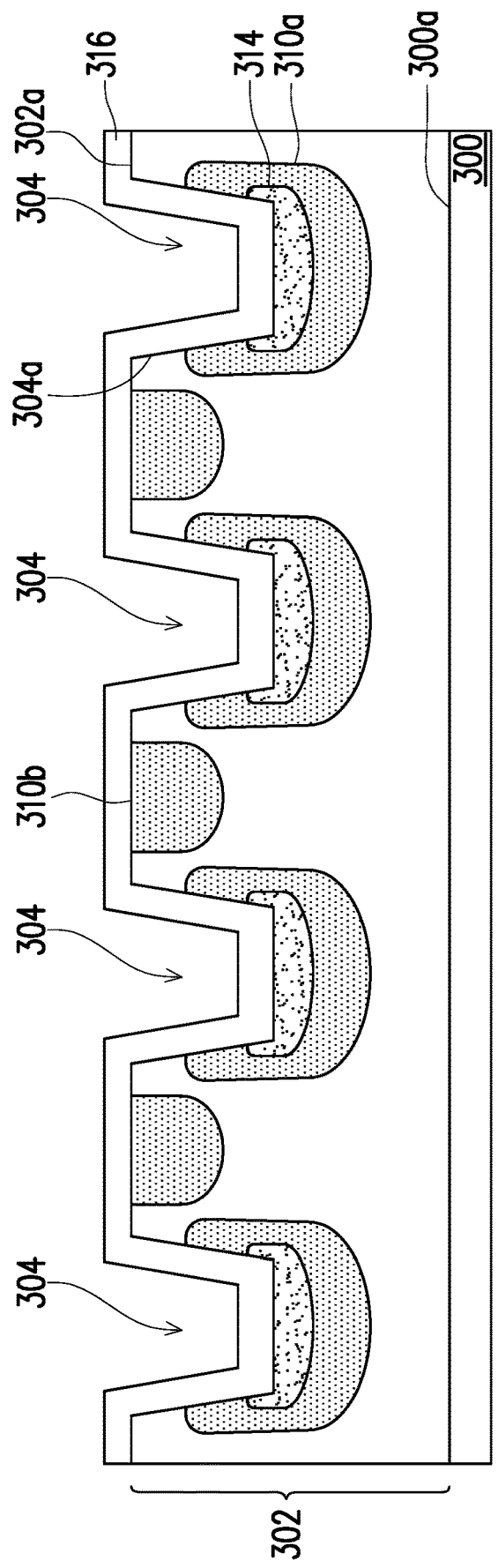

Thereafter, referring to FIG. 3H, the second mask layer 312 is first removed, and then a third mask layer 316 is formed. The third mask layer 316 is conformally deposited on the top 302a of the drift layer 302, the sidewall 304a and the bottom 304b of each of the V-grooves 304.

Figure 3I:
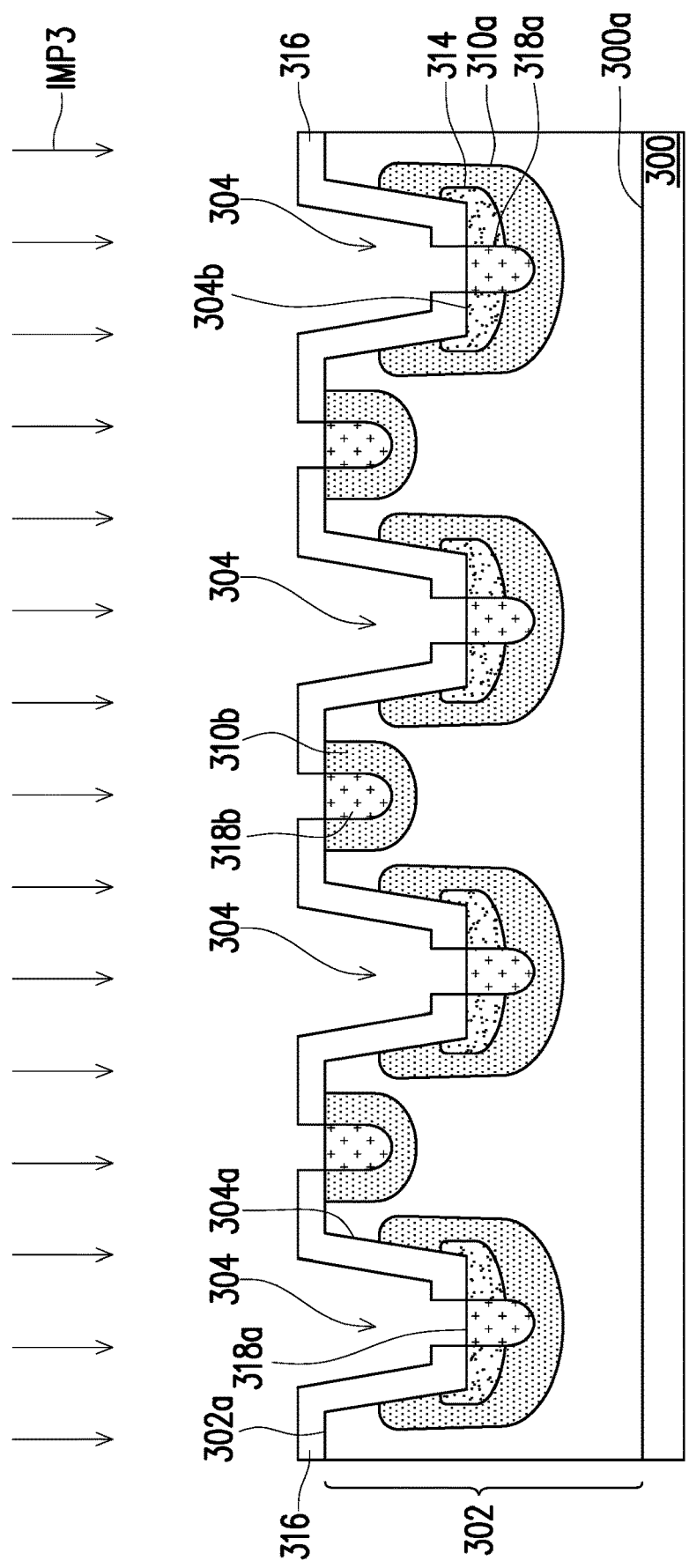

Then, referring to FIG. 3I, the third mask layer 316 is patterned to expose a portion of the bottom 304b of each of the V-grooves 304 and a portion of the top 302a of the drift layer 302. An ion implantation IMP3 is performed on the drift layer 302 to form a plurality of first well pick-up regions 318a in the drift layer 302 to pass through the plurality of source regions 314 and contact with the plurality of first well regions 310a; and form a plurality of second well pick-up regions 318b in the second well regions 310b. The second well pick-up regions 318b are surrounded by the second well region 310b and are in contact with the second well regions 310b. The steps of forming the plurality of first well pick-up regions 318a and forming the plurality of second well pick-up regions 318b are simultaneously performed. However, the disclosure is not limited herein. The first and second well pick-up regions 318a, 318b may be P+ region, and the doping concentration of the first and second well pick-up regions 318a, 318b is ranged from $5E18/cm^3$ to $2E20/cm^3$, for instance.

Figure 3J:
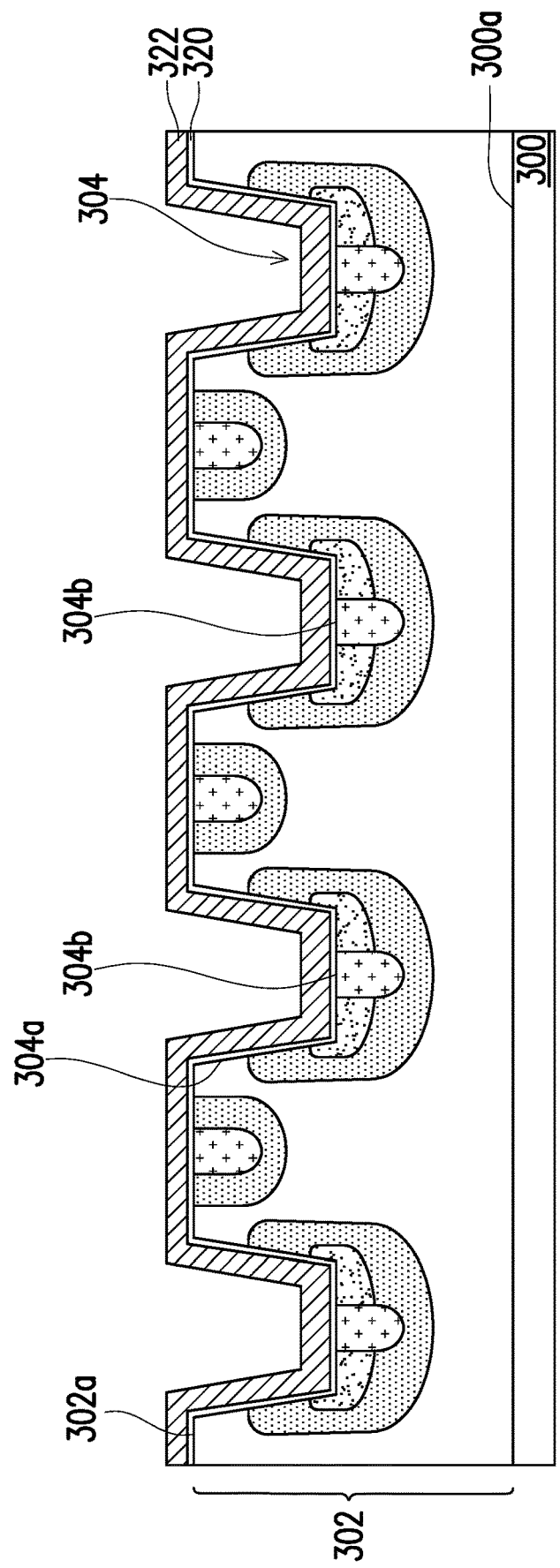

Thereafter, referring to FIG. 3J, the third mask layer 316 is removed, and then a gate insulation layer 320 is conformally formed on the top 302a of the drift layer 302 and the bottom 304b and the sidewalls 304a of each of the V-grooves 304. The gate insulation layer 320 may be a gate oxide with a thickness ranged from 300 Å to 1,200 Å. A gate layer 322 is formed on the gate insulation layer 320 to cover the bottom 304b and the sidewalls 304a of each of the V-grooves 304 and the top 302a of the drift layer 302 between the V-grooves 304, wherein the gate layer 322 is, for example, a polysilicon layer.

Figure 3K:
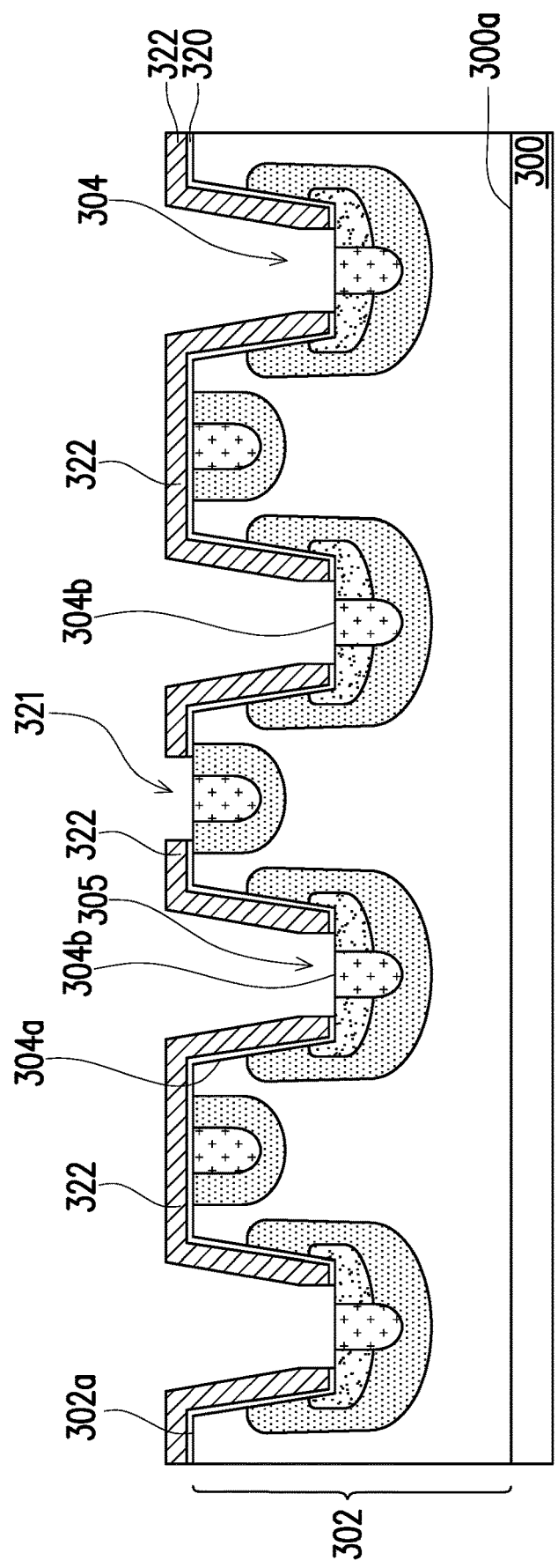

After that, referring to FIG. 3K, the gate layer 322 and the gate insulation layer 320 are etched to form first openings 305 at the bottom 304b of each of the V-grooves 304 and form a second opening 321 at the top 302a of the drift layer 302 between the V-grooves 304. Each of the first openings 305 exposes the second well pick-up region 318a and the corresponding source region 314. The second opening 321 exposes the second well pick-up region 318b and the corresponding second well region 310b. The method of forming the first opening 305 and the second opening 321 may include performing an anisotropic etching on the gate layer 322 and the gate insulation layer 320 using a patterned photoresist (not shown) covering a portion of the top 302a of the drift layer 302 and the sidewall 304a of each the V-grooves 304.

Figure 3L:
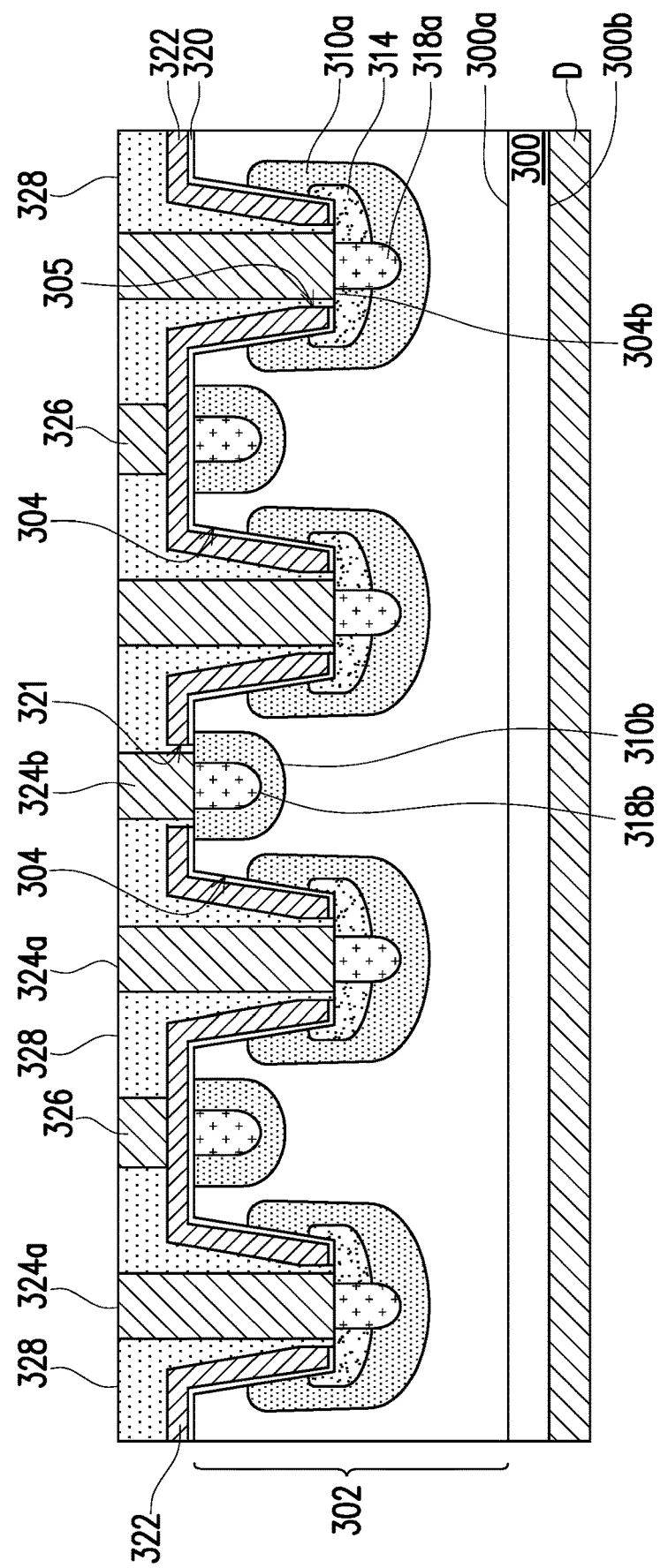

Last, referring to FIG. 3L, a plurality of source electrodes 324a, a plurality of contacts 324b and a plurality of gate electrodes 326 are formed together. The source electrodes 324a are formed inside the first openings 305 on the bottom 304b of each of the V-grooves 304 to be in direct contact with the first well pick-up regions 318a and the source regions 314. The contacts 324b are formed inside the second opening 321 on the top 302a of the drift layer 302 between the V-grooves 304 to be in direct contact with the second well pick-up region 318b. The gate electrodes 326 are formed on the gate layer 322 to be not in contact with the second well pick-up region 318b. The method of forming the source electrodes 324a, the contacts 324b and the gate electrodes 326 may include forming an insulation layer 328 on the drift layer 302, etching the insulation layer 328 to form openings, each opening is corresponding to the first opening 305, the second opening 321 or the gate layer 322 on the top 302a, and depositing conductive material (e.g. metal or alloy) in the openings. After forming the source electrodes 324a, the contacts 324b and gate electrodes 326, a drain electrode D is formed on a bottom surface 300b of the SiC substrate 300.

FIG. 4 is a top view of a silicon carbide semiconductor power transistor according to a third embodiment of the disclosure, wherein the reference symbols used in the first embodiment are used to equally represent the same or similar components. The description of the same components can be derived from the first embodiment, and will not be repeated herein.

Referring to FIG. 4, the silicon carbide semiconductor power transistor of the third embodiment includes a plurality of V-grooves 104, a plurality of source regions 108, a gate layer 110, a connection section 114, a plurality of first well pick-up regions 114a, a plurality of second well pick-up regions 114b, a plurality of first openings 105, a plurality of second openings 121, and a gate electrode 118.

Referring to FIG. 4 again, the V-grooves 104 are extended along a first direction Y and parallel to each other in a second direction X perpendicular to the first direction Y. The first opening 105 is extended along the first direction Y and formed in each of the V-grooves 104. The second opening 121 is extended along the first direction Y and formed between the V-grooves 104. The first opening 105 and the second opening 121 are alternately disposed along the second direction X.

Then referring to FIG. 4, the connection section 114 electrically connects with (for example, be directly in contact with) the first well pick-up regions 114a and the second well pick-up region 114b to make the first well pick-up regions 114a and the second well pick-up region 114b having equal potential. The gate electrode 118 is disposed on the connection section 114 and extends along the second direction X.

Figure 5A:
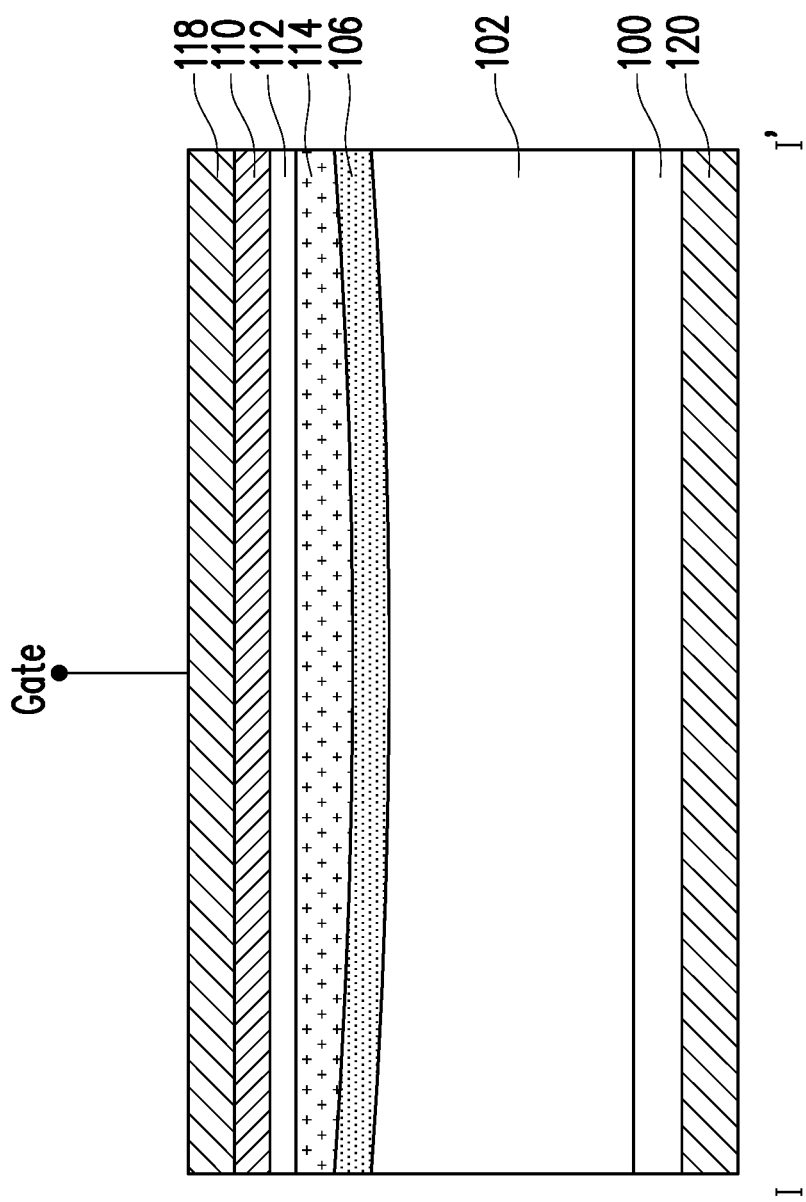
FIG. 5A shows a cross-sectional view of line I-I' of the silicon carbide semiconductor power transistor of FIG. 4.
Figure 5B:
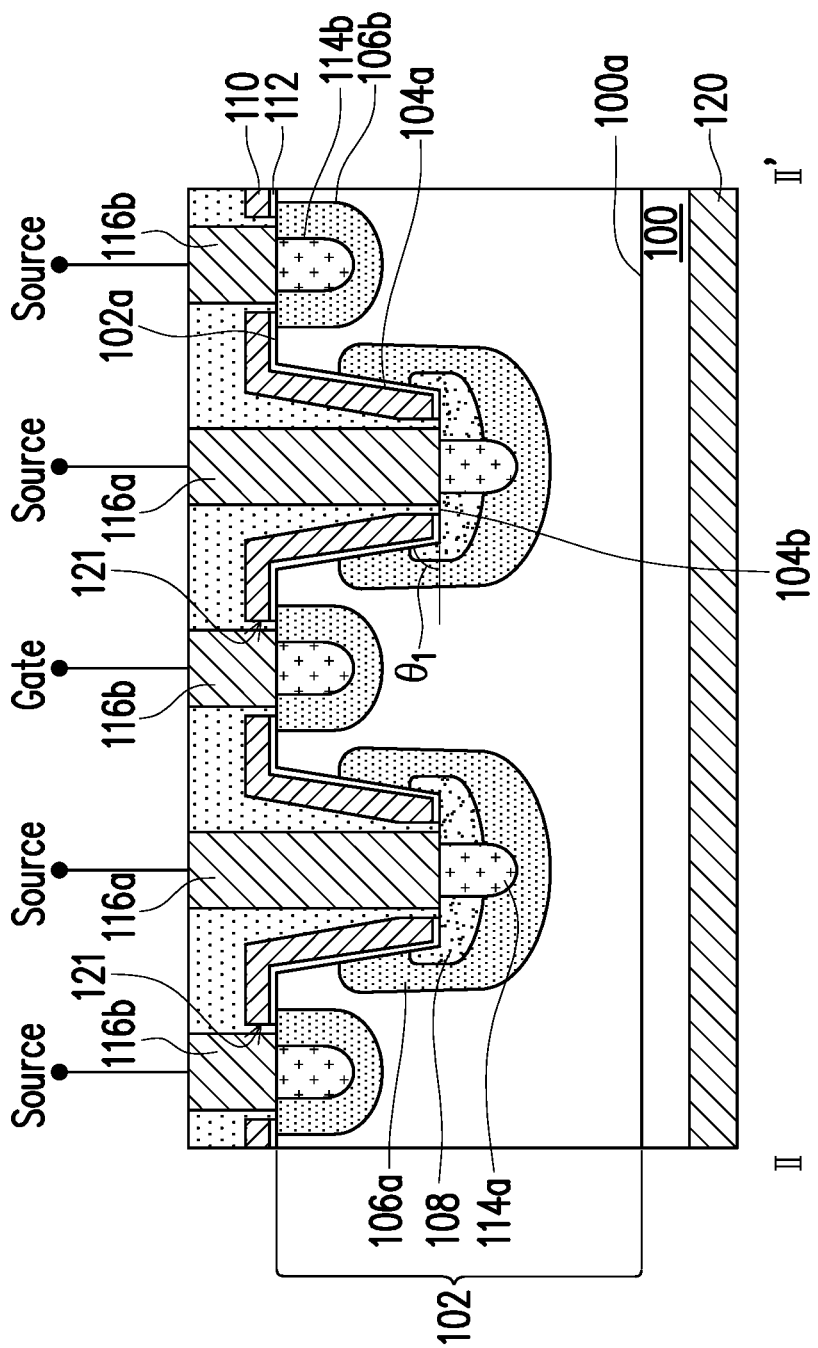
FIG. 5B shows a cross-sectional view of line II-II' of the silicon carbide semiconductor power transistor of FIG. 4.

FIG. 5A shows a cross-sectional view of line I-I' of the silicon carbide semiconductor power transistor of FIG. 4. FIG. 5B shows a cross-sectional view of line II-II' of the silicon carbide semiconductor power transistor of FIG. 4.

Referring to FIG. 5A, a cross-sectionally sequential stack of a drain electrode 120, a substrate 100, a drift layer 102, a connection well region 106, the connection section 114, a gate insulation layer 112, the gate layer 110, and the gate electrode 118 are shown. The connection well region 106 is connected with (for example, be directly in contact with) the first well regions 106a and the second regions 106b, shown in FIG. 5B. The gate electrode 118 is not in contact with the connection section 114. The gate electrode 118 is electrically connected to the gate layer 110.

Referring to FIG. 5B, unless specific description, the definition of the reference symbols is the same as the definition the corresponding reference symbols of FIG. 2A to FIG. 2B, and will not be repeated herein. The first opening 105 and the second opening 121 are alternately disposed. Therefore, a plurality of source electrodes 116a disposed inside the first openings 105 and a plurality of contacts 116b disposed inside the second opening 121 are alternately disposed.

In summary, according to the silicon carbide semiconductor power transistor of the disclosure, the second well regions and the second well pick-up regions disposed in the top of the drift layer between the V-grooves are in contact with the contacts that are equal potential with the source electrodes. Hence, a drain-source capacitance (Cds) is formed in the top of the drift layer between the V-grooves, so as to reduce the Cgd capacitance. The gate electrodes disposed on the gate layer are not in contact with the second well pick-up regions to form a gate-source capacitance (Cgs). Therefore, the side effects of Cgd capacitance such as high transient loss in the device switch on and switch off operation, and the device reliability issue in the switch on-off can be reduced due to forming Cds and Cgs instead of Cgd. Since the Cgd of disclosure V-grooves N-MOSFET is reduced, the silicon carbide semiconductor power transistor has excellent effects on an on-off switch operation.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A silicon carbide semiconductor power transistor, comprising:
    a substrate made of silicon carbide (SiC);
    a drift layer disposed on a plane of the substrate, wherein a plurality of V-grooves is formed in the drift layer;
    a gate layer formed on the drift layer to cover a bottom and sidewalls of each of the V-grooves and a top of the drift layer between the V-grooves, wherein a first opening is formed in the gate layer at the bottom of each of the V-grooves, and a second opening is formed in the gate layer at the top of the drift layer between the V-grooves;
    a gate insulation layer disposed between the drift layer and the gate layer;
    a plurality of first well regions disposed in the drift layer around the bottom and the sidewalls of each of the V-grooves;
    a plurality of second well regions disposed in the top of the drift layer between the V-grooves;
    a plurality of source regions disposed within the first well regions;
    a plurality of first well pick-up regions disposed in the drift layer to pass through the plurality of source regions and contacts with the plurality of first well regions;
    a plurality of second well pick-up regions disposed in the second well regions;
    a plurality of source electrodes disposed inside the first openings on the bottom of each of the V-grooves to be in direct contact with the first well pick-up regions and the source regions; and
    a plurality of contacts disposed inside the second opening on the top of the drift layer between the V-grooves to be in direct contact with the second well pick-up region.

2. The silicon carbide semiconductor power transistor of claim 1, wherein the V-grooves are parallel to each other.

3. The silicon carbide semiconductor power transistor of claim 1, wherein in a top view, the V-grooves comprise first wave-shaped V-grooves and second wave-shaped V-grooves mirrored with respect to each other and extended along a first direction, each of the first and second wave-shaped V-grooves having straight sections that are alternately connected by curved sections, the straight sections of the first and second wave-shaped V-grooves are alternately separated by a first distance and a second distance, the first distance is greater than the second distance, and the second opening is formed on the top between the first and second wave-shaped V-grooves separated from the first distance.

4. The silicon carbide semiconductor power transistor of claim 3, further comprising: a plurality of gate electrodes disposed on the gate layer between the first and second wave-shaped V-grooves separated from the second distance.

5. The silicon carbide semiconductor power transistor of claim 3, further comprising: a connection section extends along a second direction and electrically connects with the first well pick-up regions and the second well pick-up region, wherein the second direction is perpendicular to the first direction.

6. The silicon carbide semiconductor power transistor of claim 1, wherein the plane of the substrate is one of {1000} orientation planes, one of {1100} orientation planes, or one of {11-20} orientation planes.

7. The silicon carbide semiconductor power transistor of claim 1, wherein the substrate, the drift layer, and the source regions have a first conductive type, and the first and second well regions and the first and second well pick-up regions have a second conductive type.

8. The silicon carbide semiconductor power transistor of claim 1, wherein the bottom of each of the V-grooves exposed from the first opening and the top of the drift layer exposed from the second opening have an exposed area with a width of from 1.0 µm to 2.0 µm, respectively.

9. A method of manufacturing a silicon carbide semiconductor power transistor, comprising:
    forming a drift layer on an upper surface of a silicon carbide (SiC) substrate;
    forming a plurality of V-grooves in the drift layer,
    forming a plurality of first well regions in the drift layer around a bottom and sidewalls of each of the V-grooves;
    forming a plurality of second well regions in a top of the drift layer between the V-grooves;
    forming a plurality of source regions within the first well regions;
    forming a plurality of first well pick-up regions in the drift layer to pass through the plurality of source regions and contacts with the plurality of first well regions;
    forming a plurality of second well pick-up regions in the second well regions;
    forming a gate insulation layer conformally on the top of the drift layer and the bottom and the sidewalls of each of the V-grooves;
    forming a gate layer on the gate insulation layer to cover the bottom and the sidewalls of each of the V-grooves and the top of the drift layer between the V-grooves;
    etching the gate layer and the gate insulation layer to form a first opening at the bottom of each of the V-grooves and form a second opening at the top of the drift layer between the V-grooves;
    forming a plurality of source electrodes inside the first openings on the bottom of each of the V-grooves to be in direct contact with the first well pick-up regions and the source regions; and
    forming a plurality of contacts inside the second opening on the top of the drift layer between the V-grooves to be in direct contact with the second well pick-up region.

10. The method of manufacturing a silicon carbide semiconductor power transistor of claim 9, wherein the V-grooves are parallel to each other.

11. The method of manufacturing a silicon carbide semiconductor power transistor of claim 9, wherein the step of forming the plurality of V-grooves 304 comprises forming the V-grooves comprising first wave-shaped V-grooves and second wave-shaped V-grooves mirrored with respect to each other and extended along a first direction, each of the first and second wave-shaped V-grooves having straight sections that are alternately connected by curved sections, the straight sections of the first and second wave-shaped V-grooves are alternately separated by a first distance and a second distance, the first distance is greater than the second distance, and the second opening is formed on the top between the first and second wave-shaped V-grooves separated from the first distance.

12. The method of manufacturing a silicon carbide semiconductor power transistor of claim 11, further comprising: forming a plurality of gate electrodes on the gates between the first and second wave-shaped V-grooves separated from the second distance.

13. The method of manufacturing a silicon carbide semiconductor power transistor of claim 11, further comprising: forming a connection section to extend along a second direction and electrically connect with the first well pick-up regions and the second well pick-up region, wherein the second direction is perpendicular to the first direction.

14. The method of manufacturing a silicon carbide semiconductor power transistor of claim 9, wherein the steps of forming the plurality of first well regions and forming the plurality of second well regions are simultaneously performed.

15. The method of manufacturing a silicon carbide semiconductor power transistor of claim 9, wherein the steps of forming the plurality of first well pick-up regions and forming the plurality of second well pick-up regions are simultaneously performed.

16. The method of manufacturing a silicon carbide semiconductor power transistor of claim 9, further comprising: forming a drain electrode on a bottom surface of the SiC substrate.

17. The method of manufacturing a silicon carbide semiconductor power transistor of claim 9, wherein the upper surface of the SiC substrate is one of {1000} orientation planes, one of {1100} orientation planes, or one of {11-20} orientation planes.

* * * * *